US009093421B2

(12) United States Patent
Erickson et al.

(10) Patent No.: US 9,093,421 B2
(45) Date of Patent: Jul. 28, 2015

(54) IMPLEMENTING GATE WITHIN A GATE UTILIZING REPLACEMENT METAL GATE PROCESS

(75) Inventors: Karl L. Erickson, Rochester, MN (US); Phil C. Paone, Rochester, MN (US); David P. Paulsen, Dodge Center, MN (US); John E. Sheets, II, Zumbrota, MN (US); Gregory J. Uhlmann, Rochester, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 86 days.

(21) Appl. No.: 13/533,484

(22) Filed: Jun. 26, 2012

(65) Prior Publication Data

US 2013/0341720 A1    Dec. 26, 2013

(51) Int. Cl.
| | |
|---|---|
| *H01L 29/78* | (2006.01) |
| *H01L 21/336* | (2006.01) |
| *H01L 29/423* | (2006.01) |
| *H01L 29/66* | (2006.01) |
| *H01L 29/51* | (2006.01) |

(52) U.S. Cl.
CPC ...... *H01L 29/4238* (2013.01); *H01L 29/66484* (2013.01); *H01L 29/66545* (2013.01); *H01L 29/7831* (2013.01); *H01L 29/517* (2013.01); *H01L 29/66628* (2013.01); *H01L 29/66636* (2013.01); *H01L 29/7848* (2013.01)

(58) Field of Classification Search
CPC ............... H01L 21/28079; H01L 21/28088; H01L 21/2815; H01L 29/4238; H01L 29/4983; H01L 29/517; H01L 29/66484; H01L 29/66553; H01L 29/66545; H01L 29/6656; H01L 29/42372; H01L 29/66477

USPC ................ 438/596, 176, 183; 257/407, 412
See application file for complete search history.

(56) References Cited

U.S. PATENT DOCUMENTS

| | | | | |
|---|---|---|---|---|
| 5,599,726 | A | * | 2/1997 | Pan ............................... 438/304 |
| 5,600,168 | A | * | 2/1997 | Lee ............................... 257/336 |
| 5,960,270 | A | * | 9/1999 | Misra et al. ................... 438/197 |
| 6,174,794 | B1 | * | 1/2001 | Gardner et al. ............... 438/595 |

(Continued)

OTHER PUBLICATIONS

J. M. Hergenrother et al., "The Vertical Replacement-Gate (VRG) MOSFET: a 50-nm Vertical MOSFET with Lithography-Independent Gate Length," International Electron Devices Meeting, IEDM, 1999, pp. 75-78.

(Continued)

*Primary Examiner* — Khiem D Nguyen
*Assistant Examiner* — Pauline Vu
(74) *Attorney, Agent, or Firm* — Joan Pennington

(57) ABSTRACT

A method and circuit for implementing field effect transistors (FETs) having a gate within a gate utilizing a replacement metal gate process (RMGP), and a design structure on which the subject circuit resides are provided. A field effect transistor utilizing a RMGP includes a sacrificial gate in a generally central metal gate region on a dielectric layer on a substrate, a source and drain formed in the substrate, a pair of dielectric spacers, a first metal gate and a second metal gate replacing the sacrificial gate inside the central metal gate region, and a second gate dielectric layer separating the first metal gate and the second metal gate. A respective electrical contact is formed on opposite sides of the central metal gate region for respectively electrically connecting the first metal gate and the second metal gate to a respective voltage.

9 Claims, 11 Drawing Sheets

(56) References Cited

U.S. PATENT DOCUMENTS

| | | | |
|---|---|---|---|
| 6,312,995 B1 * | 11/2001 | Yu | 438/283 |
| 6,320,222 B1 | 11/2001 | Forbes et al. | |
| 6,329,232 B1 * | 12/2001 | Yang et al. | 438/197 |
| 6,329,248 B1 * | 12/2001 | Yang | 438/267 |
| 6,372,559 B1 | 4/2002 | Crowder et al. | |
| 6,548,870 B1 * | 4/2003 | Lee | 257/365 |
| 6,580,132 B1 | 6/2003 | Chan et al. | |
| 6,586,808 B1 * | 7/2003 | Xiang et al. | 257/407 |
| 6,673,663 B2 * | 1/2004 | Wu et al. | 438/217 |
| 6,744,101 B2 * | 6/2004 | Long et al. | 257/368 |
| 6,798,017 B2 | 9/2004 | Furukawa et al. | |
| 6,991,973 B2 * | 1/2006 | Chang et al. | 438/149 |
| 7,005,349 B2 * | 2/2006 | Lee et al. | 438/261 |
| 7,033,877 B2 | 4/2006 | Chaudhry et al. | |
| 7,078,282 B2 * | 7/2006 | Chau et al. | 438/183 |
| 7,666,727 B2 * | 2/2010 | Doyle et al. | 438/197 |
| 8,138,054 B2 | 3/2012 | Allen et al. | |
| 2006/0091432 A1 * | 5/2006 | Guha et al. | 257/288 |
| 2008/0038924 A1 * | 2/2008 | Rachmady et al. | 438/704 |
| 2011/0248349 A1 | 10/2011 | Christensen et al. | |

OTHER PUBLICATIONS

L. Chang et al., "Gate Length Scaling and Threshold Voltage Control of Double-Gate MOSFETs," International Electron Devices Meeting, IEDM, 2000, pp. 719-722.

I. Saad et al., "Performance Design and Simulation Analysis of Vertical Double Gate MOSFET (VDGM)," 13th International Conference on Computer Modelling and Simulation (UKSim), Mar. 30-Apr. 1 2011, pp. 518-521.

* cited by examiner

IMPLEMENTING GATE WITHIN A GATE UTILIZING REPLACEMENT METAL GATE PROCESS

FIELD OF THE INVENTION

The present invention relates generally to the data processing field, and more particularly, relates to a method and circuit for implementing field effect transistors (FETs) having a gate within a gate utilizing a replacement metal gate process (RMGP), and a design structure on which the subject circuit resides.

DESCRIPTION OF THE RELATED ART

In the pursuit of reducing chip size, the typical approach has been to reduce the device size with each technology node and then deal with device size related performance issues such as leakage.

When using a conventional Metal-Gate First construction method, it is not sustainable beyond 22 nm and the devices have become leakier and more difficult to control.

Other approaches to reducing chip sizes have been to build stacked field effect transistors (FETs) and logic functions vertically on the silicon rather than horizontally.

Another approach is to change from Metal-Gate First to a Replacement Metal Gate Process (RMGP) which is to be used at 22 nm and 14 nm before forming a FinFET device.

A need exists for an effective mechanism and method of fabricating field effect transistors (FETs) enabling reduced chip size. It is desirable to provide such effective mechanism and method that is generally simple to implement and that minimizes costs of the fabrication process.

SUMMARY OF THE INVENTION

Principal aspects of the present invention are to provide a method and circuit for implementing field effect transistors (FETs) having a gate within a gate utilizing a replacement metal gate process (RMGP), and a design structure on which the subject circuit resides. Other important aspects of the present invention are to provide such method, circuit and design structure substantially without negative effects and that overcome many of the disadvantages of prior art arrangements.

In brief, a method and circuit for implementing field effect transistors (FETs) having a gate within a gate utilizing a replacement metal gate process (RMGP), and a design structure on which the subject circuit resides are provided. A field effect transistor utilizing a replacement metal gate process (RMGP) includes a sacrificial gate in a generally central metal gate region on a dielectric layer on a substrate, a source and drain formed in the substrate, a pair of dielectric spacers above the source and drain on opposite sides of the sacrificial gate, a first metal gate and a second metal gate replacing the sacrificial gate inside the central metal gate region, and a second gate dielectric layer separating the first metal gate and the second metal gate. A respective electrical contact is formed on opposite sides of the central metal gate region for respectively electrically connecting the first metal gate and the second metal gate to a respective voltage.

In accordance with features of the invention, the sacrificial gate inside the central metal gate region is etched and removed and a first gate metal layer is deposited on the dielectric layer. The first gate metal layer is anisotropically etched removing the bottom of the first gate metal layer together with the adjacent dielectric layer below the bottom of the first gate metal layer. The second gate dielectric layer is deposited and the remaining area in the central metal gate region is filled with a second gate metal defining the second metal gate.

In accordance with features of the invention, the second gate dielectric layer is a high dielectric constant material or high-K dielectric material disposed below the second metal gate above the substrate and between first metal gate and the second metal gate.

In accordance with features of the invention, the high-K dielectric material includes, for example, hafnium dioxide (HfO2).

In accordance with features of the invention, the electrical contact electrically connecting the first metal gate is formed with depositing the first gate metal layer, and the electrical contact electrically connecting the second metal gate is formed with depositing the second gate metal.

In accordance with features of the invention, the substrate includes a bulk substrate wafer or a substrate above a buried oxide layer in Silicon-on-Insulator (SOI) wafers.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit for implementing field effect transistors (FETs) having a gate within a gate utilizing a replacement metal gate process (RMGP), and a design structure on which the subject circuit resides are provided.

Referring now to FIG. 1-5, exemplary processing steps for fabricating field effect transistors (FETs) having a gate within a gate utilizing a replacement metal gate process (RMGP) in accordance with preferred embodiments. Referring also to FIG. 6-10, example process steps for implementing contacts structures for electrical connection with each gate of the field effect transistors (FETs) having a gate within a gate utilizing a replacement metal gate process (RMGP) of FIGS. 1-5 in accordance with a preferred embodiment. FIGS. 1-10 are shown in simplified form sufficient for understanding the invention.

Figure 1:
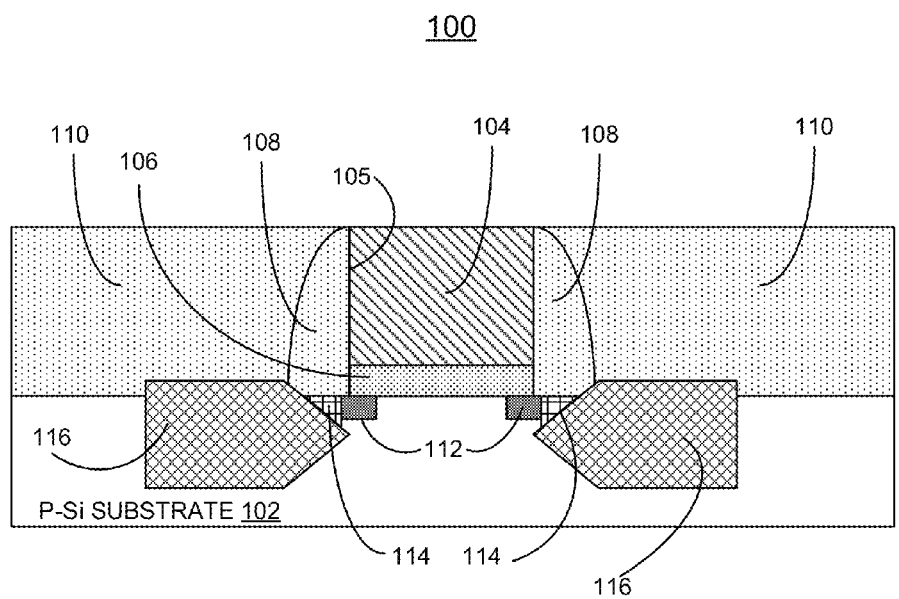
FIGS. 1-5 are side views not to scale illustrating example processing steps for fabricating field effect transistors (FETs) having a gate within a gate utilizing a replacement metal gate process (RMGP) in accordance with a preferred embodiment.

In FIG. 1, an initial processing step 100 begins with a standard replacement metal gate process (RMGP) generally designated by the reference character 100. As shown, the initial RMGP 100 includes a substrate 102, such as a P-Silicon substrate of a bulk substrate wafer or a substrate above a buried oxide layer of a Silicon-on-Insulator (SOI) wafer. While a substrate that is P-doped silicon is shown for the substrate 102, an oppositely doped substrate or N—Si substrate could be used.

As shown in FIG. 1, a field effect transistor (FET) of the initial RMGP 100 includes a sacrificial gate 104 in a generally central metal gate region 105 above a dielectric layer 106 formed on the substrate 102, and a pair of dielectric spacers 108 on opposite sides of the sacrificial gate 104 in a planarization dielectric layer 110. A high dielectric constant material forms the dielectric layer 106, such as hafnium dioxide (HfO2). The dielectric spacers 108 are formed of, for example, silicon dioxide (SiO2). The FET of the initial RMGP 100 includes diffusion edges of a lightly doped region 112 and an extension 114, and a source and drain (S/D) 116 formed in the substrate 102. The lightly doped region or lightly doped drain 112 is a reduced concentration implant implanted before forming one of dielectric spacers 108. The extension 114 is a light implant provided before any spacer deposition including dielectric spacers 108. The source and drain (S/D) 116, for example, are formed of a silicon germanium alloy.

In accordance with features of the invention, a first metal gate and a second metal gate replace the sacrificial gate 104 inside the central metal gate region 105, with a second gate dielectric layer separating the first metal gate and the second metal gate as shown in FIGS. 2-5.

Figure 2:
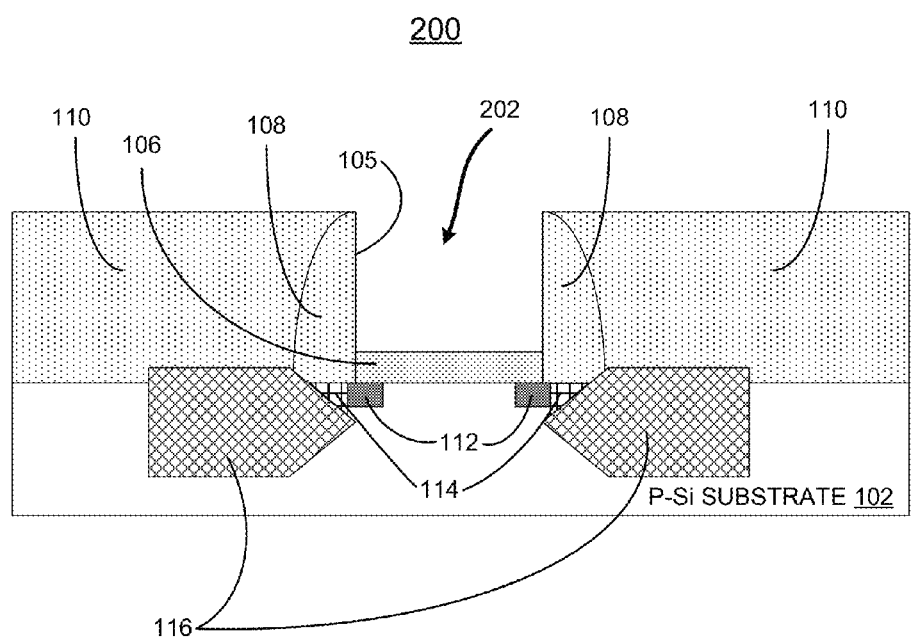

In FIG. 2, a next processing step generally designated by the reference character 200 is illustrated. As indicated by 202, the sacrificial gate 104 is etched and removed from the central metal gate region 105.

Figure 3:
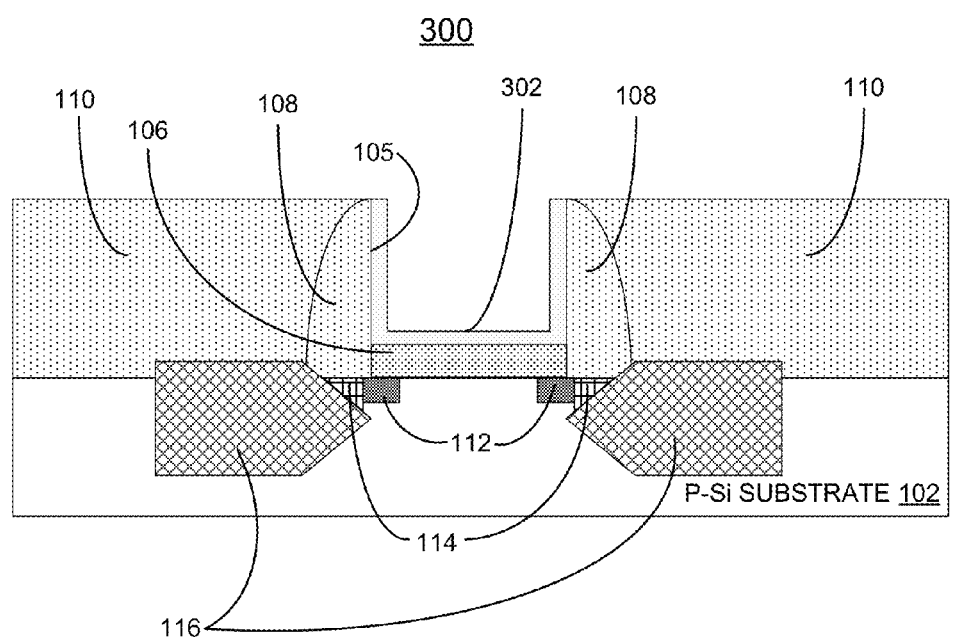

In FIG. 3, a next processing step generally designated by the reference character 300 is illustrated. A first gate metal layer 302 is deposited on the dielectric layer 106.

Figure 4:
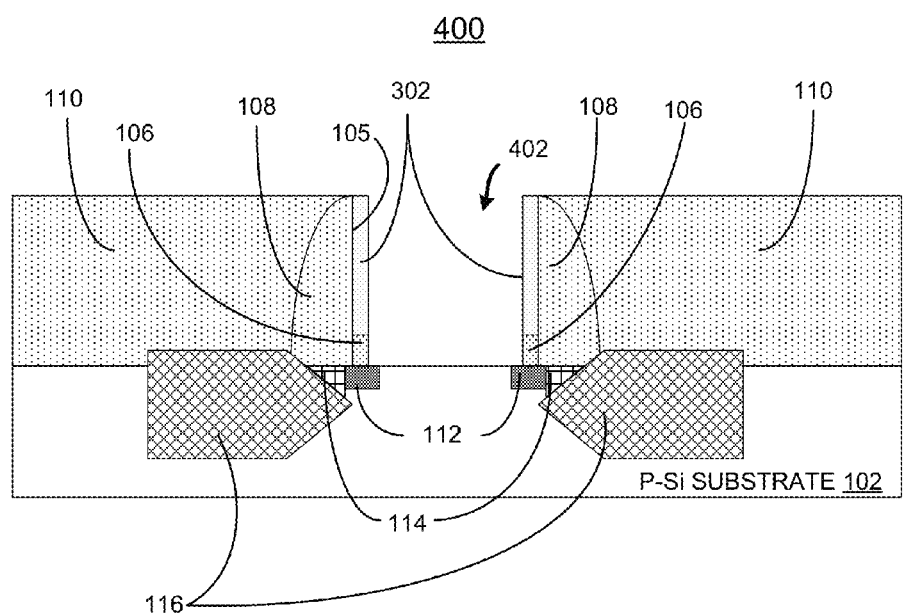

In FIG. 4, a next processing step generally designated by the reference character 400 is illustrated. As indicated by 402, the first gate metal layer 302 is anisotropically etched removing the bottom of the first gate metal layer and removing the adjacent portion of dielectric layer 106 below the first gate metal layer 302.

Figure 5:
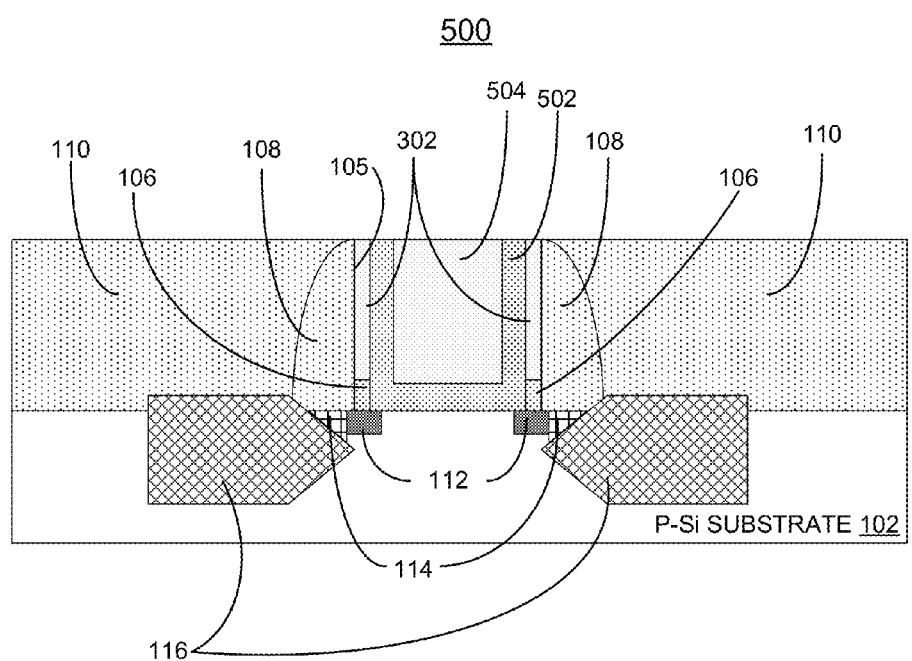

In FIG. 5, a next processing step generally designated by the reference character 500 is illustrated. A second gate dielectric layer 502 is deposited and the remaining area in the central metal gate region 105 is filled with a second gate metal defining the second metal gate 504.

The first gate metal 302 and the second gate metal 504 preferably include a high temperature metal, for example, tantalum, tungsten, tantalum nitride, and titanium nitride, or alternatively a silicided polysilicon gate or a combination of highly doped polycrystalline silicon alloyed with tantalum, tungsten, cobalt, or another high temperature metal. The dielectric layer 106 below the first gate metal layer 302 and the second gate dielectric layer 502 are formed with a high dielectric constant material. The high-K dielectric material includes, for example, hafnium dioxide (HfO2).

In accordance with features of the invention, a respective electrical contact is formed on opposite sides of the central metal gate region for respectively electrically connecting the first metal gate and the second metal gate to a respective voltage as shown in the illustrated contact processing steps of FIGS. 6-10. These electrical contact processing steps are performed with the processing steps for fabricating field effect transistors (FETs) having the gate within a gate utilizing a replacement metal gate process (RMGP) in accordance with preferred embodiments illustrated in FIGS. 1-5. The illustrated electrical contacts shown in FIGS. 6-10 are not shown in the side views of FIGS. 1-5.

Figure 6:
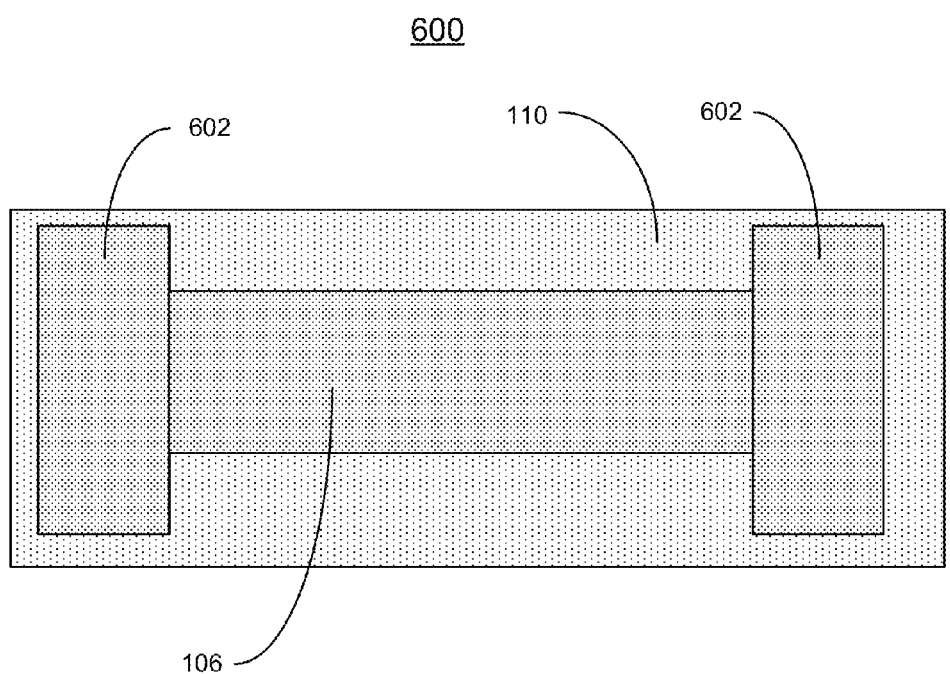
FIGS. 6-10 are plan views not to scale illustrating example process steps for implementing contacts structures for electrical connection with each gate of the field effect transistors (FETs) having a gate within a gate utilizing a replacement metal gate process (RMGP) of FIGS. 1-5 in accordance with a preferred embodiment.

In FIG. 6, a contact processing step generally designated by the reference character 600 is illustrated, which corresponds to processing step 200 of FIG. 2. When the sacrificial gate 104 is etched and removed from the central metal gate region 105 the dielectric layer 106 is exposed, a pair of respective contact areas 602 is exposed.

Figure 7:
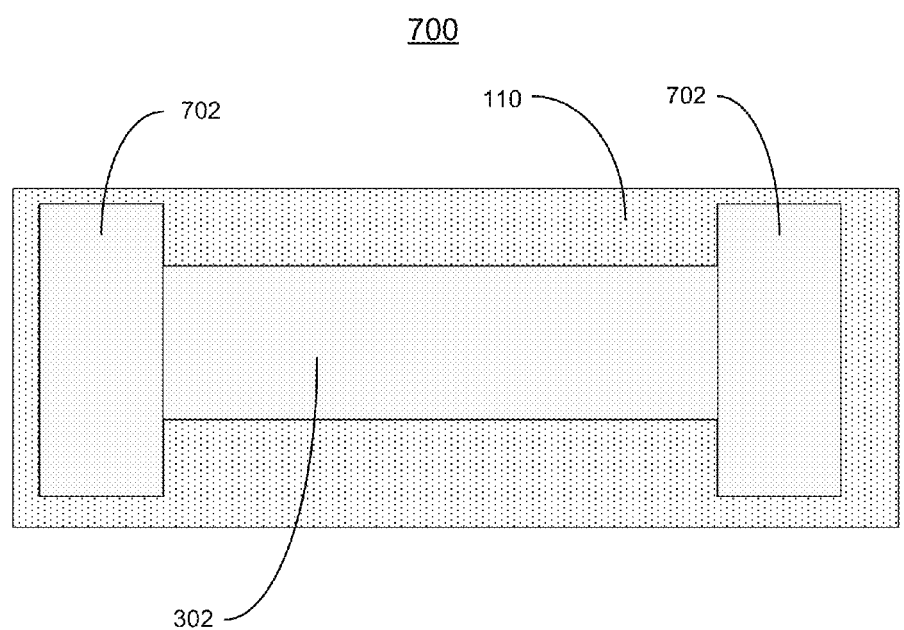

In FIG. 7, a next contact processing step generally designated by the reference character 700 is illustrated, which corresponds to the first gate metal deposit processing step 300 of FIG. 3. A metal deposit layer 702 is provided over the respective contact areas 602.

Figure 8:
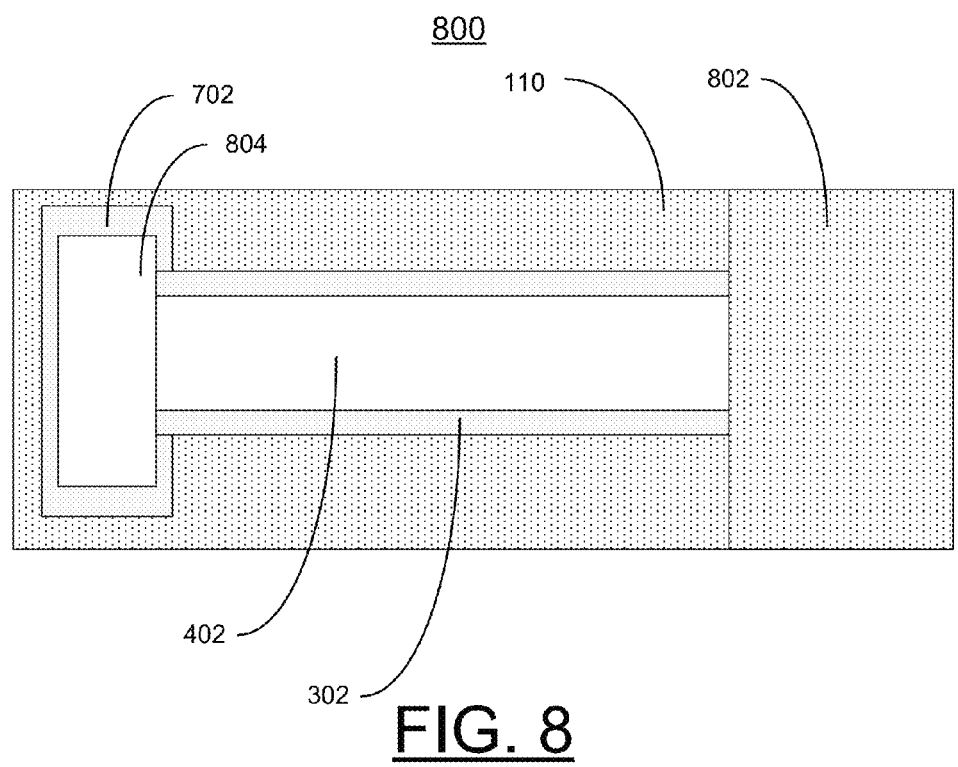

In FIG. 8, a next contact processing step generally designated by the reference character 800 is illustrated, which corresponds to the anisotropic etch of the first gate bottom in processing step 400 of FIG. 4. As shown on the right side of FIG. 8, one of the contact metal deposit layers 702 is blocked with a blocking dielectric deposit 802. The blocking dielectric deposit 802 is provided before the anisotropic etch of the bottom of first metal gate 302 indicated by 402 and the anisotropic etch 804 of the metal deposit layer 702 over the other contact areas 602 on the left side of FIG. 8.

Figure 9:
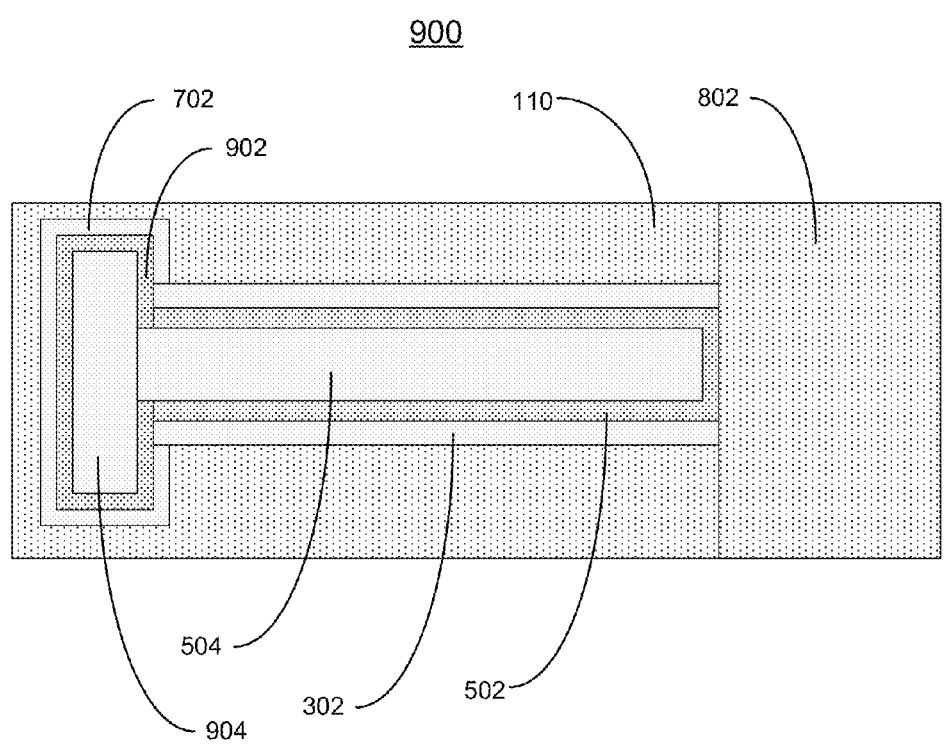

In FIG. 9, a next contact processing step generally designated by the reference character 900 is illustrated, which corresponds to deposit of the second gate dielectric 502 and the second gate metal 504 in processing step 500 of FIG. 5. A contact dielectric deposit 902 is provided before depositing a contact metal deposit 904 connecting to the second gate metal 504.

Figure 10:
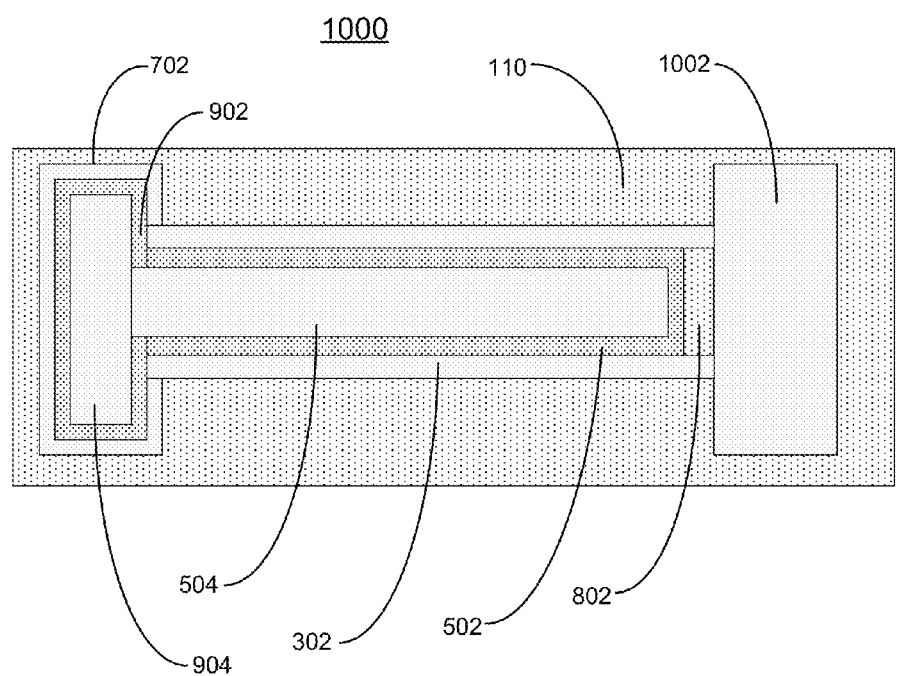

In FIG. 10, a next contact processing step generally designated by the reference character 1000 is illustrated. The blocking dielectric 802 is removed and filled providing a metal deposit layer 1002 connected to the first metal gate 302.

Figure 11:
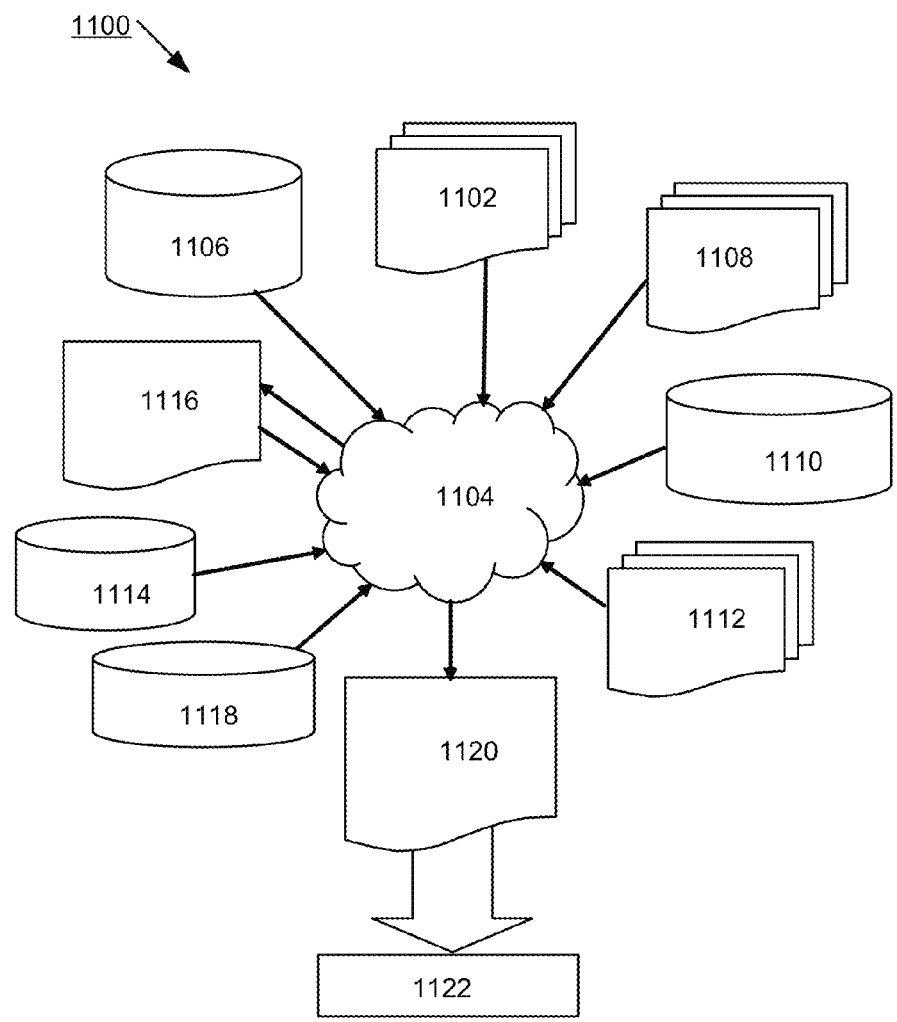
FIG. 11 is a flow diagram of a design process used in semiconductor design, manufacturing, and/or test.

FIG. 11 shows a block diagram of an example design flow 1100. Design flow 1100 may vary depending on the type of IC being designed. For example, a design flow 1100 for building an application specific IC (ASIC) may differ from a design flow 1100 for designing a standard component. Design structure 1102 is preferably an input to a design process 1104 and may come from an IP provider, a core developer, or other design company or may be generated by the operator of the design flow, or from other sources. Design structure 1102 comprises circuits 500, and 1000 in the form of schematics or HDL, a hardware-description language, for example, Verilog, VHDL, C, and the like. Design structure 1102 may be contained on one or more machine readable medium. For example, design structure 1102 may be a text file or a graphical representation of circuits 500, and 1000. Design process 1104 preferably synthesizes, or translates, circuits 500, and 1000 into a netlist 1106, where netlist 1106 is, for example, a list of wires, transistors, logic gates, control circuits, I/O, models, etc. that describes the connections to other elements and circuits in an integrated circuit design and recorded on at least one of machine readable medium. This may be an iterative process in which netlist 1106 is resynthesized one or more times depending on design specifications and parameters for the circuit.

Design process 1104 may include using a variety of inputs; for example, inputs from library elements 1108 which may house a set of commonly used elements, circuits, and devices, including models, layouts, and symbolic representations, for a given manufacturing technology, such as different technology nodes, 14 nm, 22 nm, 32 nm, 45 nm, 90 nm, and the like, design specifications 1110, characterization data 1112, verification data 1114, design rules 1116, and test data files 1118, which may include test patterns and other testing information. Design process 1104 may further include, for example, standard circuit design processes such as timing analysis, verification, design rule checking, place and route operations, and the like. One of ordinary skill in the art of integrated circuit design can appreciate the extent of possible electronic design automation tools and applications used in design process 1104 without deviating from the scope and spirit of the invention. The design structure of the invention is not limited to any specific design flow.

Design process 1104 preferably translates an embodiment of the invention as shown in FIGS. 1-10 along with any additional integrated circuit design or data (if applicable), into a second design structure 1120. Design structure 1120 resides on a storage medium in a data format used for the exchange of layout data of integrated circuits, for example, information stored in a GDSII (GDS2), GL1, OASIS, or any other suitable format for storing such design structures. Design structure 1120 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-10. Design structure 1120 may then proceed to a stage 1122 where, for example, design structure 1120 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing a field effect transistor said method comprising:

utilizing a replacement metal gate process (RMGP) including a sacrificial gate formed in a central metal gate region on a dielectric layer on a substrate, a source and drain formed in the substrate, a pair of dielectric spacers above the source and drain on opposite sides of the sacrificial gate;

etching and removing the sacrificial gate inside the central metal gate region and exposing a pair of contact areas disposed on opposite sides of the central metal gate region;

depositing a first gate metal layer on the dielectric layer;

anisotropically etching said first gate metal layer and removing a bottom of said first gate metal layer together with an adjacent dielectric layer below the bottom of said first gate metal layer;

depositing a second gate dielectric layer on said first gate metal layer and the substrate;

depositing a second metal gate on said second gate dielectric layer filling a remaining area in the central metal gate region; and forming a respective electrical contact at said exposed pair of contact areas disposed on said opposite sides of the central metal gate region for respectively electrically connecting said first metal gate layer and said second metal gate to a respective voltage by depositing an electrical contact layer for electrically connecting said first metal gate layer with the depositing said first gate metal layer on the dielectric layer includes providing a blocking dielectric deposit before performing the anisotropically etching said first metal gate layer; and depositing another electrical contact layer for electrically connecting said second metal gate with the depositing said second metal gate on said second gate dielectric layer.

2. The method as recited in claim 1 wherein the etching and removing the sacrificial gate inside the central metal gate region includes removing the sacrificial gate above the dielectric layer in the central metal gate region.

3. The method as recited in claim 1 wherein the depositing the first gate metal layer on the dielectric layer includes depositing a selected gate metal material from a group including tantalum, tungsten, tantalum nitride, and titanium nitride.

4. The method as recited in claim 1 wherein the depositing the second gate dielectric layer on said first gate metal layer and the substrate includes depositing a high dielectric constant material forming said second gate dielectric layer.

5. The method as recited in claim 1 wherein the depositing the second metal gate on said second gate dielectric layer filling the remaining area in the central metal gate region includes depositing a selected gate metal material from a group including tantalum, tungsten, tantalum nitride, and titanium nitride.

6. The method as recited in claim 1 wherein the depositing the another electrical contact layer for electrically connecting said second metal gate with the depositing said second metal gate on said second gate dielectric layer includes providing a contact dielectric deposit before depositing a second contact metal layer connecting to said second metal gate.

7. The method as recited in claim 1 wherein the source and drain formed in the substrate is formed of a silicon germanium alloy.

8. The method as recited in claim 1 wherein the dielectric layer on the substrate below the sacrificial gate is formed of a high dielectric constant material.

9. The method as recited in claim 1 wherein the substrate includes a bulk substrate wafer or a substrate above a buried oxide layer in a Silicon-on-Insulator (SOI) wafer.

\* \* \* \* \*